United States Patent
Dähn

(10) Patent No.: US 6,539,505 B1
(45) Date of Patent: Mar. 25, 2003

(54) METHOD OF TESTING A SEMICONDUCTOR MEMORY, AND SEMICONDUCTOR MEMORY WITH A TEST DEVICE

(75) Inventor: Wilfried Dähn, Celle (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/574,702

(22) Filed: May 18, 2000

(30) Foreign Application Priority Data

May 18, 1999 (DE) .......................... 199 22 786

(51) Int. Cl.⁷ .............................................. G11C 29/00
(52) U.S. Cl. ................................... 714/718; 714/733
(58) Field of Search ............................... 714/720, 710, 714/718, 797, 733; 365/201, 200; 702/117

(56) References Cited

U.S. PATENT DOCUMENTS

| | | | | |
|---|---|---|---|---|
| 5,790,559 A | * | 8/1998 | Sato ........................... | 714/720 |
| 5,909,448 A | * | 6/1999 | Takahashi ................... | 365/201 |
| 5,996,096 A | * | 11/1999 | Dell et al. ................... | 714/710 |
| 6,018,482 A | * | 1/2000 | Fujita ......................... | 365/200 |
| 6,115,833 A | * | 9/2000 | Sato et al. .................. | 714/718 |
| 6,154,872 A | * | 11/2000 | Jones .......................... | 714/797 |
| 6,173,238 B1 | * | 1/2001 | Fujisaki ...................... | 702/117 |

FOREIGN PATENT DOCUMENTS

| | | |
|---|---|---|
| DE | 198 12 198 A1 | 10/1998 |
| DE | 197 25 581 A1 | 1/1999 |

* cited by examiner

*Primary Examiner*—David Ton
(74) *Attorney, Agent, or Firm*—Laurence A. Greenberg; Werner H. Stemer; Gregory L. Mayback

(57) ABSTRACT

In order to test a semiconductor memory, a bit fail map is generated in that a predetermined data value is written to memory cells and subsequently read out and compared with the data value that has been written. The bit fail map is buffer-stored on the semiconductor memory in a memory bank other than the one that is currently being tested. Reliability of the test method is improved since defects in different memory banks can be regarded as independent of one another. It is advantageous for the bit fail map to be stored three times in different memory banks and for a majority decision to be taken during read-out.

4 Claims, 2 Drawing Sheets

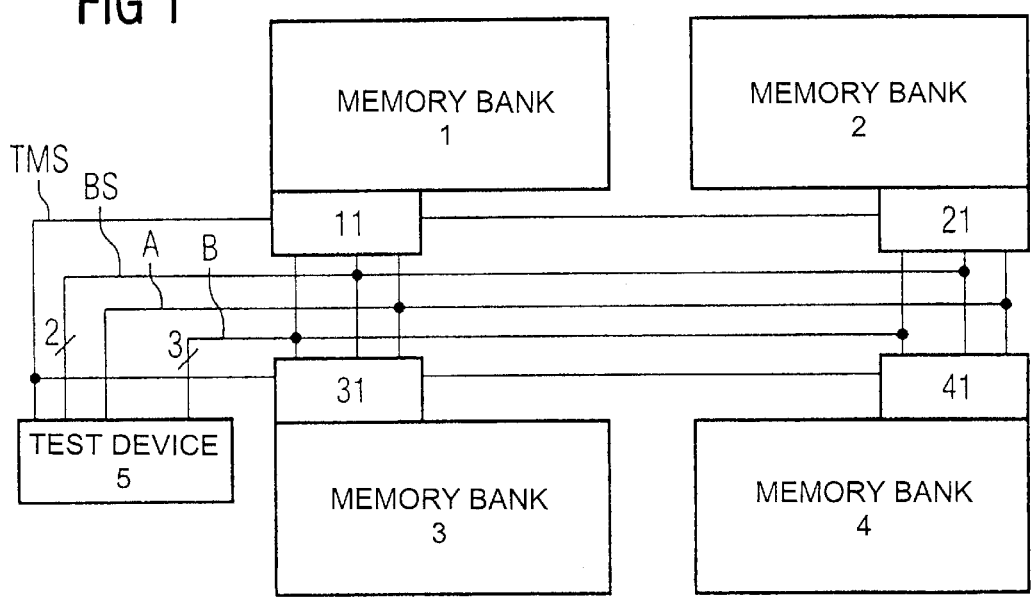
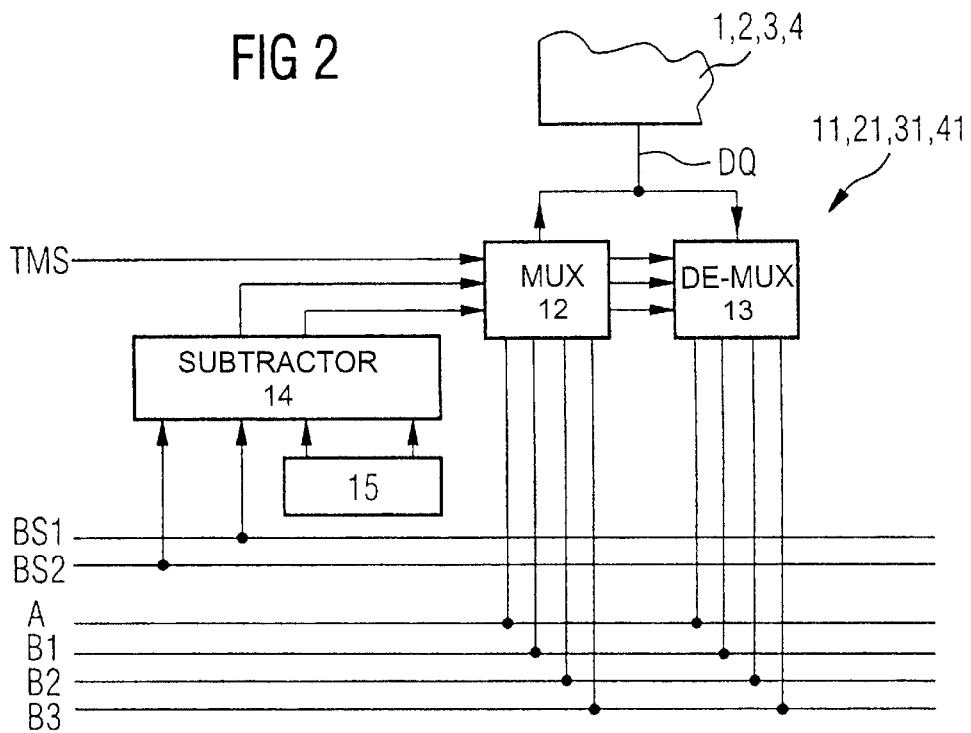

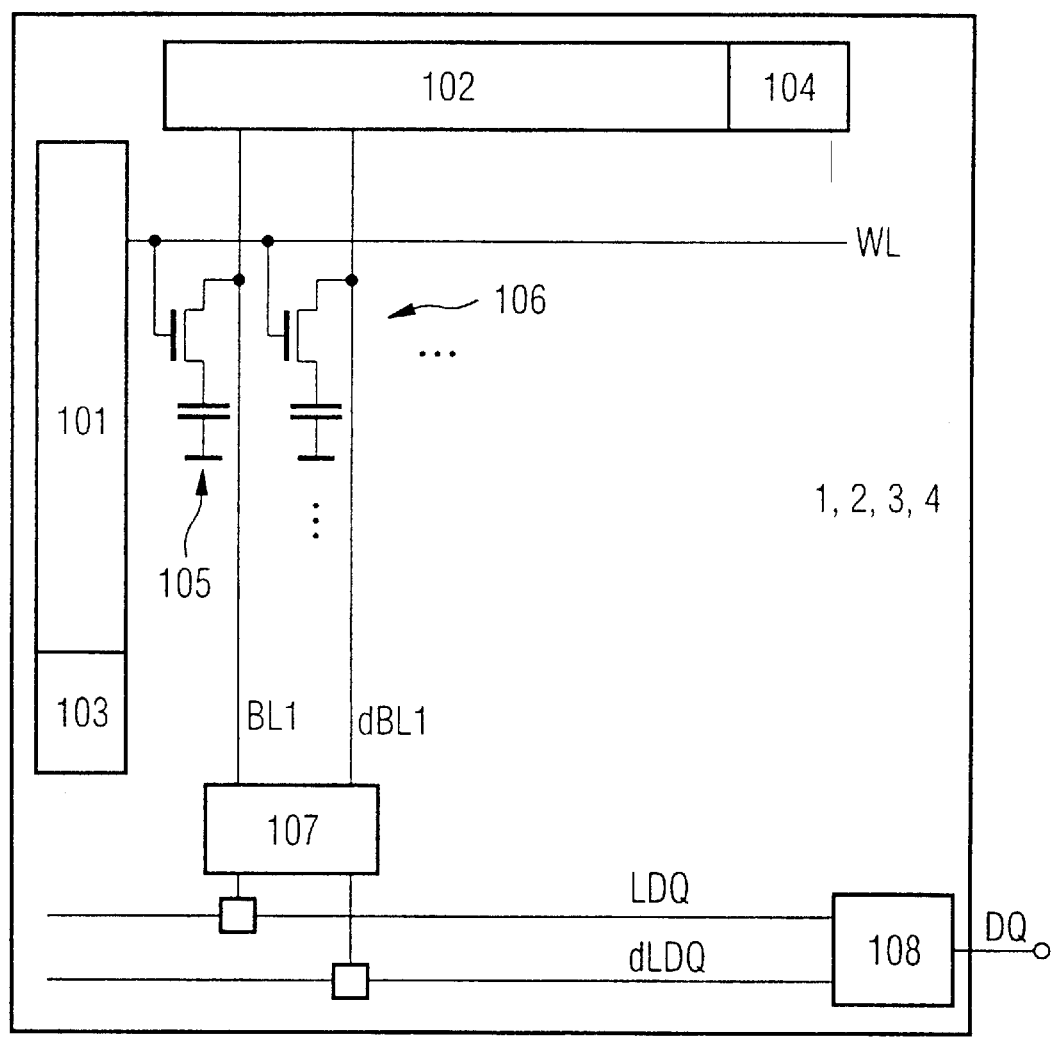

METHOD OF TESTING A SEMICONDUCTOR MEMORY, AND SEMICONDUCTOR MEMORY WITH A TEST DEVICE

BACKGROUND OF THE INVENTION

Field of the Invention

The invention lies in the semiconductor technology field. More specifically, the invention relates to a method for testing a semiconductor memory, in which a predetermined data value is written to a memory cell, read out and compared with the data value that has been read out in order to buffer-store the comparison result in another portion of the memory cells for a subsequent redundancy analysis. The invention further relates to a semiconductor memory with a test device which controls such a memory test.

In order to check the functionality of a semiconductor memory after the latter has been fabricated, the individual memory cells are tested. Defective memory cells are subsequently replaced by redundant memory cells in order to establish full functionality. During the functional test, a predetermined data value is written to the memory cells and is subsequently read out and compared with the predetermined data value. Due to the fact that the data input and output bandwidth between semiconductor chip and automatic test machine constitutes a bottleneck, endeavors are made to ensure that as many test steps as possible run on the semiconductor chip itself, without the need to communicate with the automatic test machine.

Commonly assigned German patent application DE 197 25 581 A1 describes a method for testing a semiconductor memory and also a corresponding semiconductor memory, in which a so-called bit fail map is created by comparing written data and desired values for a first area of the memory. The bit fail map is buffer-stored in up to three copies on the semiconductor chip in other, as yet untested memory areas. During read-out, a comparison is made of all three copies of each of the test results in the bit fail map. The value which occurs the most often is used further. A redundancy analysis in which the bit fail map is processed further is used to determine which defective memory cells are to be replaced by redundant memory cells, so that as far as possible all defects can be eliminated and the memory can be found to be functional.

The functional defects of a semiconductor memory generally do not occur in uniform distribution over the memory cell array, but rather accumulate along columns or rows of the matrix-like memory cell array. If, by way of example, a defect occurs in an address decoder, the result of this is that all the memory cells of the word lines affected by the defect can no longer be accessed. If one of the word lines is interrupted, it is no longer possible to access a portion of the memory cells which are addressed by the respective word line. Defects occur in a corresponding manner in memory cells connected to a bit line, if the bit line, the read/write amplifier assigned to the bit line, or that part of the address decoder which decodes the bit line are defective.

Even though the bit fail map is stored multiple times in as yet untested memory areas in the method described in the published application DE 197 25 581 A1, there is nevertheless the risk of a plurality of copies of the bit fail map being interfered with in the same sense on account of a uniform defect extending along a row or column. Despite a majority decision during read-out of the bit fail map, incorrect defect data are processed further. The supply of redundant memory cells is usually used up earlier than necessary. On the other hand, it can happen that defective memory cells are not identified as such.

SUMMARY OF THE INVENTION

It is accordingly an object of the invention to provide a semiconductor memory test method and a semiconductor memory with a test device, which overcomes the above-mentioned disadvantages of the heretofore-known devices and methods of this general type and which yields more reliable test results.

A further object of the invention is to specify a corresponding semiconductor memory with a test device which controls the test sequence.

With the foregoing and other objects in view there is provided, in accordance with the invention, a method of testing a semiconductor memory with a plurality of memory banks, which comprises the following steps:

writing a predetermined data value to a memory cell of a first portion of memory cells in a first memory bank of a semiconductor memory;

reading out the data value from the memory cell, comparing the read-out data value with the predetermined data value, and determining a data value for a comparison result;

buffer-storing the data value for the comparison result in a memory cell in another portion of memory cells in a second memory bank of the semiconductor memory;

reading out the stored data value for the comparison result and carrying out a redundancy analysis in which defective memory cells of the first portion of memory cells are replaced by redundant memory cells.

In other words, the novel method provides for the memory cells to be tested to be arranged in a first memory bank, and the defect data to be stored on the chip be buffer-stored in memory cells of a second, other memory bank. This is based on the consideration that memory banks are memory areas that can be operated autonomously and independently of one another and the defects in different memory banks can therefore be regarded as independent of one another. In particular, row and column defects do not propagate from one memory bank to another memory bank. This is because memory banks have address decoders and read/write amplifiers which access only memory cells of precisely this memory bank. Bit lines and word lines within a memory bank extend exclusively only within precisely this memory bank. If values of the bit fail map in a memory bank are corrupted by defects present therein, it can normally be assumed that the same memory cells in another memory bank are not defective.

In accordance with an added feature of the invention, the data value for the comparison result is stored in parallel in at least three memory cells arranged in respectively different memory banks. Generally, the bit fail map is stored an odd number of times, in respective different memory banks. In all probability, corruption of one copy of the bit fail map in one memory bank will not occur at the same location in another memory bank. The correct defect information is obtained by means of a majority decision applied to corresponding values, originating from the same memory cell to be tested, of different copies of the bit fail map from different memory banks.

In accordance with an additional feature of the invention, the at least three data values of the comparison result stored in parallel are read out, and a single data value is determined from the at least three data values by means of a majority decision, and the single data value is subsequently fed to the redundancy analysis.

In accordance with another feature of the invention, each memory bank comprises an address decoder for selecting memory cells only of the respective memory bank.

With the above and other objects in view there is also provided, in accordance with the invention, a semiconductor memory, comprising:

- a plurality of memory banks including a first memory bank and at least one second memory bank, each memory bank having memory cells;
- a test device connected to the memory banks and programmed to test the semiconductor memory by writing a predetermined data value to a memory cell of the first memory bank, reading out the data value from the memory cell of the first memory bank, comparing the read-out data value with the predetermined data value in order to determine a data value for the comparison result, by buffer-storing the data value for the comparison result in a memory cell of the second memory bank, and by reading out the stored data value for the comparison result for carrying out a redundancy analysis.in which defective memory cells of the first memory bank are replaced by redundant memory cells.

In accordance with a further feature of the invention, each memory bank comprises an address decoder for selecting memory cells, and the address decoder is adapted to only select the memory cells of the respective memory bank.

In accordance with again an added feature of the invention, the plurality of memory banks are at least three memory banks each containing memory cells, and the test device is adapted to store the data value for the comparison result in parallel in a respective memory cell of the three memory banks.

In accordance with again a further feature of the invention, the test device is adapted to determine, from the data values for the comparison result read from the different memory banks, a single data value with a majority decision and to feed the single data value to the redundancy analysis.

In accordance with a concomitant feature of the invention, a changeover device is connected to each memory bank, the changeover device containing a multiplexer and a demultiplexer, the changeover device is connected to receive a respective address for selecting a memory bank, a terminal for a data signal of the memory bank connected to the output of the multiplexer and the input of the demultiplexer, the input of the multiplexer and the output of the demultiplexer each being connected to a signal line for the predetermined data value to be stored and the data value to be read out subsequently, and to a signal line for the data value for the comparison result to be written and to be read out subsequently.

Different memory banks operate independently of one another. In conventional memory architectures, different memory banks can be accessed simultaneously in the same timing cycle. One access cycle suffices, therefore, for storing a plurality of copies of the bit fail map in different memory banks. During the storage of the bit fail map, it is actually possible, in the memory bank to be tested, to test a further memory cell (or else groups of memory cells, depending on the organization of the test), whose test result is stored once again in the different memory banks in the subsequent access cycle. Since the bit fail map is determined iteratively and writing and reading are effected multiple times during the test, there is a considerable increase in the test speed by comparison with the method described in the above-mentioned published patent application DE 197 25 581 A1.

Other features which are considered as characteristic for the invention are set forth in the appended claims.

Although the invention is illustrated and described herein as embodied in a method for testing a semiconductor memory, and semiconductor memory with a test device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic block diagram of a semiconductor memory having four memory banks and a test device according to the invention;

FIG. 2 is a block diagram of an access control device assigned to a respective one of the memory banks; and FIG. 3 is a diagram of a detail with relevant parts of a memory bank.

DESCRIPTION OF THE PREFERRED EMBODIMENTS

Referring now to the figures of the drawing in detail and first, particularly, to FIG. 1 thereof, there is seen a semiconductor memory with four memory banks 1, 2, 3, and 4. The four memory banks operate independently of one another with regard to memory accesses. Only the circuits for transferring data to or from the semiconductor chip may be used jointly. For the functional test of the semiconductor memory after th e latter has been fabricated, a test device 5 which controls the test sequence is provided. Each of the memory banks is assigned a bank selection circuit 11, 21, 31, and 41, respectively, which controls the data transfer between the memory banks and the test device 5 and also between the memory banks themselves during the test. To that end, the test device generates a signal TMS indicating that the semiconductor memory is in the test mode, and a signal BS, which comprises 2 bits and is a bank address. Furthermore, there is a bus for a data signal A, which carries a data value to be written to the memory cells of a memory bank during the testing of the latter, and the subsequent data value to be read out. In addition, there is a bus for a signal B comprising 3 bits, which constitute three copies of a defect information item for a tested memory cell. This defect information item is read into the other three, currently untested memory banks or is read out from there for further processing.

The test of the semiconductor memory proceeds as follows:

First of all, the memory cells of the memory bank 1 are tested by writing a predetermined data value to each memory cell by means of the signal A. The predetermined data value that has been written is read out from the memory cells as signal A, fed to the test device 5 and compared with the formerly written, predetermined data value as desired value. If there is correspondence between data value read out and desired value written in, it is ascertained that the respective memory cell functions properly. This test result is stored three times in the other memory banks 2, 3, 4, expediently in those respective memory cells of the memory banks 2, 3, 4 whose relative address corresponds to that address of the memory cell currently being tested in the memory bank 1. The comparison results are buffer-stored three times in parallel. This is repeated for all the memory cells of the memory bank 1, so that a defect matrix for the memory cell array of the memory bank 1, a so-called bit fail map, is present in each case in the other memory banks 2, 3 4. As the test proceeds further, the inverted previous datum is used for the predetermined data value to be written to the memory cells of the memory bank 1, the bit fail map being updated by the previous value of the bit fail map being read out in each of the memory banks 2, 3, 4 and, in the test device 5, being OR-combined with the newly obtained defect information and subsequently being. re-stored. Then, using further test algorithms, predetermined data values can be written to the memory cells, subsequently read out and compared with the predetermined values in order to update the bit fail map further. Specific types of defect in the memory cell array 1 are thereby determined. At the end of the test, the defect information contained in the bit fail map is processed further, in order to replace the memory cells that have been ascertained as defective in the memory bank 1 by redundant memory cells present therein. To that end, the three copies of the bit fail map which are buffer-stored in the memory banks 2, 3, 4 are read out and compared with one another in the test device 5. The bit value which occurs the most often in the three copies—associated with a memory cell to be tested—of the defect information in the bit fail maps is ascertained.

This data value, obtained by majority decision, for the defect information is fed to a redundancy analysis, which determines which defective memory cells are to be replaced by redundant memory cells. Conventionally, individual memory cells cannot be replaced, but rather only larger sections of rows or columns, so that the redundancy analysis carries out optimization to the effect that as far as possible all of the defective memory cells are repaired by the limited supply of redundant rows and columns.

When the bit.fail map is stored in the memory banks 2, 3, 4, these memory banks are still untested and may in turn contain defective memory cells. However—as is explained in even further detail with reference to FIG. 3—it can be assumed that the defects occurring in the memory banks 2, 3, 4 are independent of one another. Therefore, if a data value of the bit fail map is corrupted by a defective memory cell in which it is stored, for example in the memory bank 2, the other two copies of this data value of the bit fail map in the memory banks 3, 4 will not, in all probability, be defective. The correct data value of the bit fail map is obtained by selecting, from the three associated copies of this data value which are stored in the memory banks 2, 3, 4, that value which occurs the most often.

In principle, it suffices for the bit fail map to be stored once in a memory bank other than the one tested, in order to achieve an increase in the reliability of the test. The reliability of the test is increased further, as described above, by means of a multiple, preferably odd-numbered, at least triple, copy of the bit fail map in different memory banks in each case and a subsequent majority decision.

At the beginning of the test, all the memory banks are still untested and may contain defective memory cells. After the first memory bank has been tested and defective memory cells have been repaired, a check has not yet been made to see whether the repair has been carried out without any faults or whether the redundant memory cell is fully functional. Therefore, during the test of the next memory bank, the bit fail map is preferably buffer-stored once again in a triple copy in the other memory banks.

The redundancy analysis can be carried out in an automatic test machine outside the chip. To that end, the test device 5, using the majority decision, compresses the triple copies of the bit fail map to form a single bit fail map and outputs the latter to the automatic test machine. For redundancy correction, the automatic test machine controls a laser or a programming current, by means of which elements, so-called fuses, which can be programmed by means of laser or by means of high current, are programmed on the chip in order to replace defective memory cells by redundant memory cells. As an alternative to this, the redundancy analysis can also be processed on the chip in the test device 5, so that only the information regarding which memory cells are to be replaced is output to the automatic test machine. The test device 5 can be realized as a sequential circuit or in the form of software and firmware of a test processor.

One of the block selection circuits 11, 21, 31, 41 is illustrated in detail in FIG. 2. The block selection circuit is connected to an input and output DQ for a data signal of the assigned memory bank 1, 2, 3 or 4, respectively. The data terminal DQ is connected to the output of a multiplexer 12 and to the input of a demultiplexer 13. The inputs of the multiplexer and the outputs of the demultiplexer are in each case connected to the signal lines for the signal A and the three bits B1, B2, B3 of the signal B. The multiplexer 12 and the demultiplexer 13 are put into the test state by the signal TMS. By means of the two bits BS1, BS2 of the bank address BS, the multiplexer 12 and the demultiplexer 13 are activated in the event of an access to the memory bank. To that end, the bank address BS1, BS2 is fed to a subtractor 14. The latter subtracts from the bank address the respective individual number of the bank provided by the device 15. If bank address and bank number correspond, the subtractor 14 determines the value 0, so that the data terminal DQ of the memory bank is connected to the line for the signal A via multiplexer 12 and demultiplexer 13. A predetermined data value can then be written to a memory cell of the memory bank or the data value that was written in previously can be read out. If the subtractor 14 ascertains that bank address BS and bank number are different, the data terminal DQ of the memory bank is connected to a respective one of the signal lines B1, B2 or B3 of the signal B via multiplexer 12 and demultiplexer 13. One of the values B1, B2 or B3 of the bit fail map is then written to the memory bank or read from the latter. With the exception of different bank numbers provided by the device 15, the same bank selection circuit is used for all four memory banks.

The basic structure of a memory bank is illustrated in FIG. 3. The memory bank contains memory cells which are arranged in rows and columns and for which the memory cells 105 and 106 are illustrated by way of example. A row can be activated by means of a word line WL. A column is selected via bit lines. Adjacent bit lines BL1, dBL1 are connected to a read/write amplifier 107. One of the bit lines, for example BL1, carries the information to be stored in noninverted form, and the other of the bit lines, for example dBL1, carries the information to be stored in inverted form. The read/write amplifier 107 amplifies the data value that is to be written to the memory cell 105 or 106 or that is to be read from the latter. The data values are finally switched to the input and output terminal DQ via respective noninverted collective lines LDQ and inverted collective lines dLDQ and corresponding further multiplexers and drivers.

One of the word lines in each case can be activated by a row decoder 101. One of the bit lines is activated by a column decoder 102. For replacing defective memory cells by redundant memory cells, a section 103 is provided in the row decoder and a section 104 is provided in the column decoder. Fuses which are present therein are correspondingly programmed, so that a redundant word or bit line is selected instead of a defective word or bit line. What is essential is that the row and column decoders can activate only word lines or bit lines which extend within this memory bank. A further characterizing feature of a memory bank is that the read/write amplifiers are connected to bit lines which extend only within this memory bank.

If a defect occurs on a word line or bit line, or at the corresponding decoders or at the sense amplifier, although a significant portion or the entire portion of the affected row or column can no longer be accessed, such row or column defects extend only within the memory bank. The defect does no t continue in another memory bank, for instance in the corresponding row or column in address terms. Therefore, any defects in the other memory bank can be regarded as independent of the defects in the first memory bank. If a data value in a copy of the bit fail map is corrupted by a defect in the memory cell array, it can be assumed with high probability that a corresponding defect does not occur at the corresponding location in the other memory banks and, therefore, the data value of the bit fail map is not corrupted there. The storage of the bit fail map in a memory bank other than the one currently being tested therefore increases the reliability of the memory test. It is particularly advantageous if the bit fail map is buffer-stored at least three times in different memory banks in each case, and, during the read-out of the bit fail map, that data value which occurs with higher probability among the three copies is processed further.

I claim:

1. A semiconductor memory, comprising:

a plurality of memory banks including a first memory bank and at least one second memory bank, each memory bank having memory cells;

a test device connected to said memory banks, said test device being programmed to test the semiconductor memory by writing a predetermined data value to a memory cell of said first memory bank, reading out the data value from the memory cell of said first memory bank, comparing the read-out data value with the predetermined data value in order to determine a data value for the comparison result, by buffer-storing the data value for the comparison result in a memory cell of said second memory bank, and by reading out the stored data value for the comparison result for carrying out a redundancy analysis in which defective memory cells of said first memory bank are replaced by redundant memory cells; and a changeover device connected to each of said memory banks, said changeover device containing a multiplexer having an input and an output and a demultiplexer having an input and an output, said changeover device being connected to receive a respective address for selecting a memory bank, a terminal for a data signal of said memory bank connected to said output of said multiplexer and said input of said demultiplexer, said input of said multiplexer and said output of said demultiplexer each being connected to a signal line for the predetermined data value to be stored and the data value to be read out subsequently, and to a signal line for the data value for the comparison result to be written and to be read out subsequently.

2. The semiconductor memory according to claim 1, wherein each said memory bank comprises an address decoder for selecting memory cells, said address decoder is adapted to only select said memory cells of said respective memory bank.

3. The semiconductor memory according to claim 2, wherein said plurality of memory banks are at least three memory banks each containing memory cells, and said test device is adapted to store the data value for the comparison result in parallel in a respective memory cell of said three memory banks.

4. The semiconductor memory according to claim 3, wherein said test device is adapted to determine, from the data values for the comparison result read from the different memory banks, a single data value with a majority decision and to feed the single data value to the redundancy analysis.

* * * * *